US012626618B2

(12) United States Patent
Zhang et al.

(10) Patent No.: US 12,626,618 B2
(45) Date of Patent: May 12, 2026

(54) SPLICING DISPLAY UNIT, SPLICING DISPLAY DEVICE AND MANUFACTURING METHOD THEREOF

(71) Applicants: BOE MLED Technology Co., Ltd., Beijing (CN); BOE TECHNOLOGY GROUP CO., LTD., Beijing (CN)

(72) Inventors: Gongtao Zhang, Beijing (CN); Xuerong Wang, Beijing (CN); Qibing Gu, Beijing (CN); Haiwei Sun, Beijing (CN); Shipeng Wang, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 1023 days.

(21) Appl. No.: 17/779,655

(22) PCT Filed: Jun. 15, 2021

(86) PCT No.: PCT/CN2021/100095
§ 371 (c)(1),
(2) Date: May 25, 2022

(87) PCT Pub. No.: WO2022/022125
PCT Pub. Date: Feb. 3, 2022

(65) Prior Publication Data
US 2022/0415217 A1 Dec. 29, 2022

(30) Foreign Application Priority Data
Jul. 31, 2020 (CN) ........................ 202010764754.X

(51) Int. Cl.
G09F 9/302 (2006.01)
H05K 1/18 (2006.01)
(Continued)

(52) U.S. Cl.
CPC ........... G09F 9/3026 (2013.01); H05K 1/189 (2013.01); H10H 20/01 (2025.01);
(Continued)

(58) Field of Classification Search
CPC .............. G09F 9/3026; H10H 20/0364; H05K 2201/10128; H05K 1/14; G06F 1/1683; G09G 5/006; G09G 2370/16
See application file for complete search history.

(56) References Cited

U.S. PATENT DOCUMENTS 5,563,470 A 10/1996 Li
9,069,519 B1 6/2015 Hall
(Continued)

FOREIGN PATENT DOCUMENTS

CN 102621720 A 8/2012
CN 103700319 A 4/2014
(Continued)

OTHER PUBLICATIONS

China Patent Office, First Office Action dated Jun. 16, 2022, for corresponding Chinese application 202010764754.X.

*Primary Examiner* — Priyank J Shah
(74) *Attorney, Agent, or Firm* — HOUTTEMAN LAW LLC

(57) ABSTRACT

A splicing display unit, a splicing display device and a manufacturing method thereof are disclosed. The splicing display unit includes a display module and a signal source module. The signal source module includes a first circuit board having a power structure, a first driving structure, a first connector, at least one first wireless signal transmitter. The display module includes a second circuit board, at least one display panel, a second driving structure connected to each display panel. The second circuit board has a second connector, and at least one first wireless signal receiver
(Continued)

100:

corresponding to the display panel respectively. The first wireless signal receiver and the second connector are electrically connected to the second driving structure. The first wireless signal receiver is opposite to the first wireless signal transmitter; the first connector and the second connector are arranged in a one-to-one correspondence way and are detachably connected.

20 Claims, 10 Drawing Sheets

(51) Int. Cl.
  *H05K 1/189*        (2026.01)
  *H10H 20/01*        (2025.01)
  *H10H 20/857*       (2025.01)
(52) U.S. Cl.
  CPC . *H10H 20/857* (2025.01); *H05K 2201/10128* (2013.01); *H10H 20/0364* (2025.01)

(56) References Cited

U.S. PATENT DOCUMENTS

| | | | |
|---|---|---|---|
| 10,073,497 | B1 | 9/2018 | Liao |
| 2011/0285733 | A1 | 11/2011 | Chuang et al. |
| 2019/0295509 | A1* | 9/2019 | Chang .................... G09G 5/391 |
| 2019/0305036 | A1 | 10/2019 | Ahn et al. |
| 2020/0004078 | A1 | 1/2020 | Yabuki |
| 2020/0327851 | A1* | 10/2020 | Seo .......................... G09G 3/32 |
| 2021/0050486 | A1* | 2/2021 | Li ......................... H10H 20/855 |
| 2021/0365082 | A1* | 11/2021 | Jeong .................... G06F 3/1446 |
| 2022/0198969 | A1* | 6/2022 | Wang ........................ G09F 9/33 |
| 2022/0262285 | A1 | 8/2022 | Zhang et al. |

FOREIGN PATENT DOCUMENTS

| | | | |
|---|---|---|---|
| CN | 104141862 | A | 11/2014 |
| CN | 104361865 | A | 2/2015 |
| CN | 108154811 | A | 6/2018 |
| CN | 208045006 | U | 11/2018 |
| CN | 208077542 | U | 11/2018 |
| CN | 108986679 | A | 12/2018 |
| CN | 208368053 | U | 1/2019 |
| CN | 208477853 | U | 2/2019 |
| CN | 109785741 | A | 5/2019 |
| CN | 110323245 | A | 10/2019 |
| CN | 209591369 | U | 11/2019 |
| CN | 209691357 | U | 11/2019 |
| CN | 111128041 | A | 5/2020 |
| CN | 111128051 | A | 5/2020 |
| CN | 111276058 | A | 6/2020 |
| CN | 210839555 | U | 6/2020 |
| CN | 111402725 | A | 7/2020 |
| IN | 208922664 | U | 5/2019 |
| JP | 2012008459 | A | 1/2012 |
| TW | 309664 | B | 7/1997 |
| WO | WO2019/210513 | A1 | 11/2019 |

* cited by examiner

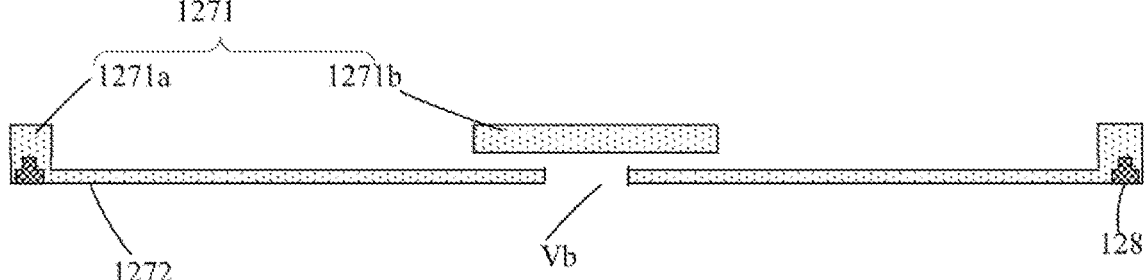
FIG. 11
FIG. 12
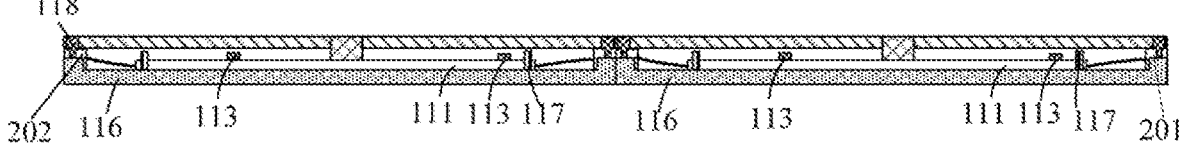
FIG. 13A

| a plurality of signal source modules and a plurality of display modules are manufactured | S1 |

| the plurality of signal source modules are spliced and fixed | S2 |

| the plurality of display modules are connected to the plurality of signal source modules in a one-to-one correspondence way | S3 |

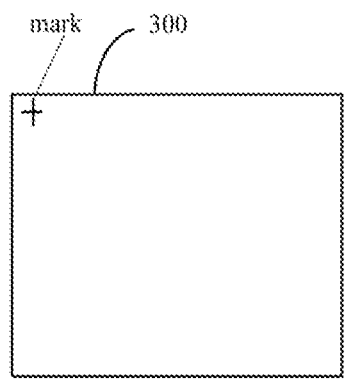
FIG. 15A
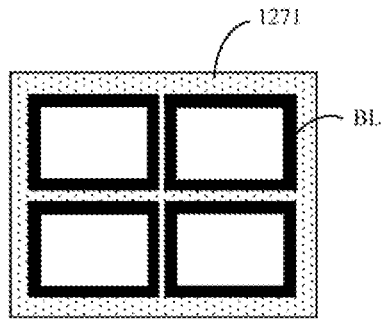
FIG. 15B
FIG. 15C
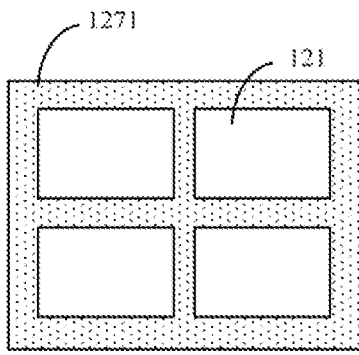
FIG. 15D

SPLICING DISPLAY UNIT, SPLICING DISPLAY DEVICE AND MANUFACTURING METHOD THEREOF

TECHNICAL FIELD

The present disclosure relates to the field of display technologies, and in particular, to a splicing display unit, a splicing display device and a manufacturing method thereof.

BACKGROUND

Splicing display technology has become more and more popular. In a splicing display system, a plurality of splicing display units are arranged to form a spliced screen. At present, the spliced screen usually has the problems such as inconvenient installation and maintenance.

SUMMARY

For solving at least one of the technical problems in the related art, the present disclosure provides a splicing display unit, a splicing display device and a manufacturing method thereof.

In order to achieve the above objective, the present disclosure provides a splicing display unit, including: a display module and a signal source module, the signal source module includes: a first circuit board provided with a power structure, a first driving structure, a first connector and at least one first wireless signal transmitter, and the first driving structure and the first connector are both electrically connected to the power structure;

the display module includes: a second circuit board, at least one display panel, and a second driving structure connected to each display panel, and the second circuit board is provided with a second connector, and at least one first wireless signal receiver in one-to-one correspondence with the display panel, and the first wireless signal receiver and the second connector are both electrically connected to the second driving structure;

wherein the first wireless signal receiver is disposed opposite to the first wireless signal transmitter in a one-to-one correspondence way; the first connector and the second connector are arranged in a one-to-one correspondence way and are detachably connected; the power structure is configured to output a power signal to the first connector and the first driving structure; the first driving structure is configured to output, according to a to-be-displayed image of each display panel, a display driving signal to the first wireless signal transmitter corresponding to the display panel; and the second driving structure is configured to control the display panel to perform display according to the power signal and the display driving signal corresponding to the display panel.

In some implementations, the display module further includes at least one flexible printed circuit in one-to-one correspondence with the display panel, one end of each flexible printed circuit is electrically connected to the display panel corresponding thereto, and the other end of each flexible printed circuit is electrically connected to the second circuit board.

In some implementations, the second driving structure includes a driver chip disposed on each flexible printed circuit, or, the second driving structure includes: a driving circuit disposed on the second circuit board.

In some implementations, the signal source module further includes a first box on which the first circuit board is disposed; and the display module further includes a second box, both the second circuit board and the display panel are disposed on the second box, and the first box is detachably connected to the second box.

In some implementations, the first box is provided with first magnetic members, the second box is provided with second magnetic members, and the first magnetic members and the second magnetic members are connected by attraction in a one-to-one correspondence way.

In some implementations, the first box includes: a bottom wall, a side wall, and a cover plate opposite to the bottom wall, the bottom wall is located on a side of the cover plate away from the display module, the first circuit board is disposed between the cover plate and the bottom wall, and a first opening exposing the first connector is provided in the cover plate;

wherein the first magnetic members are magnetic connecting members which connect the cover plate to the side wall.

In some implementations, the first circuit board is fixed on the bottom wall of the first box through a first fastener.

In some implementations, the second box includes: a rear shell, and a support frame connected to the rear shell, the support frame is located between the rear shell and the display panel, the display panel is fixed on a surface of the support frame away from the rear shell, the second circuit board is disposed between the display panel and the rear shell, and a second opening exposing the second connector is provided in the rear shell.

In some implementations, the second magnetic members are magnetic connecting members which connect the support frame to the rear shell.

In some implementations, the rear shell includes: a bottom plate part, and a side plate part connected to the bottom plate part, the support frame is connected to the side plate part, and the second circuit board is fixed on the support frame through a second fastener.

In some implementations, the cover plate of the first box includes a first insulating part opposite to the first wireless signal transmitter; and the rear shell of the second box includes a second insulating part opposite to the first wireless signal receiver.

In some implementations, the support frame and the rear shell are of a one-piece structure, and the second magnetic member is disposed on the rear shell.

In some implementations, the second circuit board is fixed on the rear shell through a second fastener.

In some implementations, an adhesive layer is provided on a surface of the support frame away from the rear shell, and the display panel is connected to the support frame through the adhesive layer.

In some implementations, the adhesive layer is an opaque adhesive layer.

In some implementations, the display panel, the support frame and the second circuit board define an accommodation space, the display module further includes at least one flexible printed circuit in one-to-one correspondence with the display panel, one end of each flexible printed circuit is electrically connected to the display panel corresponding thereto, and the other end of each flexible printed circuit is electrically connected to the second circuit board; and each flexible printed circuit is located in the accommodation space.

In some implementations, the display module includes a plurality of display panels, the support frame includes: a side frame, and a partition wall connected to the side frame, the partition wall divides a region surrounded by the side frame into a plurality of partitions, the display panels are arranged in one-to-one correspondence with the partitions, and the second circuit board is disposed between the partition wall and the bottom wall.

In some implementations, edges of each display panel do not extend beyond edges of the second box. In some implementations, the display panel includes: a substrate and a plurality of light emitting devices arranged on the substrate, the display panels in the display module are arranged in m rows and n columns, a sum L1 of dimensions of each row of display panels in a row direction is less than a dimension L2 of the second box in the row direction, and a sum W1 of dimensions of each column of display panels in a column direction is less than a dimension W2 of the second box in the column direction, where both m and n are positive integers; $nd \geq L2-L1 \geq n(a+b+c)$ and $md \geq W2-W1 \geq m(a+b+c)$, a is a dimensional tolerance of the second box, b is a grinding tolerance of the substrate of the display panel, c is assembling accuracy of the display panel and the second box, and d is 3% of center-to-center spacing of two adjacent light emitting devices.

An embodiment of the present disclosure further provide a splicing display device, including a plurality of splicing display units, wherein each of the splicing display units is the splicing display unit described above.

In some implementations, the splicing display device further includes: a transmission assembly connected between first circuit boards of every two adjacent splicing display units, the transmission assembly includes: a third connector, a fourth connector, a second wireless signal transmitter and a second wireless signal receiver, the second wireless signal transmitter and the second wireless signal receiver are respectively connected to first driving structures of the two adjacent splicing display units, and the third connector and the fourth connector are respectively connected to power structures of the two adjacent splicing display units, and third connectors and fourth connectors are arranged in a one-to-one correspondence way and are detachably connected, and second wireless signal transmitters and second wireless signal receivers are arranged opposite to each other in a one-to-one correspondence way.

An embodiment of the present disclosure further provide a manufacturing method of a splicing display device, including:

manufacturing a plurality of signal source modules and a plurality of display modules; with each of the signal source modules includes: a first circuit board provided with a power structure, a first driving structure, a first connector and a first wireless signal transmitter, and the first driving structure and the first connector are both electrically connected to the power structure; and each of the display modules includes: a second circuit board, at least one display panel, and a second driving structure connected to each display panel, and the second circuit board is provided with a second connector, and at least one first wireless signal receiver in one-to-one correspondence with the at least one display panel, and the first wireless signal receiver and the second connector are both electrically connected to the second driving structure;

splicing and fixing the plurality of signal source modules; connecting the plurality of display modules to the plurality of signal source modules in a one-to-one correspondence way, wherein first wireless signal receivers of the display modules and first wireless signal transmitters of the signal source modules are arranged opposite to each other in a one-to-one correspondence way, and first connectors and second connectors are detachably connected; power structures are configured to output power signals to the first connectors and first driving structures; the first driving structures are configured to provide display driving signals to the first wireless signal transmitters corresponding to display panels according to to-be-displayed images of the display panels; and second driving structures are configured to control the display panels to perform display according to the power signals and the display driving signals corresponding to the display panels.

In some implementations, a step of manufacturing each of the display modules includes:

providing each display panel provided with a first alignment mark;

fixing each display panel on a bearing platform, with the first alignment mark of each display panel completely overlapping a second alignment mark of the bearing platform; and fixedly connecting a second box to each display panel, and fixing the second circuit board on the second box.

In some implementations, each of the signal source modules further includes a first box on which the first circuit board is disposed, the first box is provided with a first magnetic member, and the second box is provided with a second magnetic member; and connecting the plurality of display modules to the plurality of signal source modules in the one-to-one correspondence way includes:

aligning first boxes with second boxes in a one-to-one correspondence way, connecting first magnetic members to second magnetic members by attraction in a one-to-one correspondence way, and electrically connecting first connectors to second connectors in a one-to-one correspondence way.

BRIEF DESCRIPTION OF DRAWINGS

The accompanying drawings are intended to provide a further understanding of the present disclosure, and are incorporated in and constitute a part of the specification. Together with the specific embodiments below, the drawings are used to explain the present disclosure, but do not constitute any limitation to the present disclosure. In the drawings:

FIG. 11 is a schematic diagram of a second box shown in FIG. 10.

FIG. 12 is a schematic diagram of a splicing display device according to an embodiment of the present disclosure.

FIG. 13A is a schematic diagram illustrating connection of signal source modules of two adjacent splicing display units according to an embodiment of the present disclosure.

FIG. 15A to FIG. 15F are schematic diagrams of a manufacturing process of display modules according to an embodiment of the present disclosure.

DETAIL DESCRIPTION OF EMBODIMENTS

The specific embodiments of the present disclosure are described in detail below with reference to the accompanying drawings. It should be understood that the specific embodiments described below are merely used to illustrate and explain the present disclosure, rather than limiting the present disclosure.

In order to make the objective, technical solutions and advantages of the present disclosure clearer, the technical solutions of the embodiments of the present disclosure are clearly and thoroughly described below in conjunction with the drawings. Apparently, the embodiments described herein are merely some embodiments of the present disclosure, and do not cover all embodiments. All other embodiments derived by those of ordinary skill in the art from the described embodiments of the present disclosure without inventive work fall within the scope of the present disclosure.

The terms used herein to describe the embodiments of the present disclosure are not intended to limit and/or define the scope of the present disclosure. For example, unless otherwise defined, the technical terms or scientific terms used herein should have general meanings that are understood by those of ordinary skill in the technical field of the present disclosure. It should be understood that the words "first", "second" and the like used herein do not denote any order, quantity or importance, but are just used to distinguish between different elements. Unless clearly stated in the text, the singular form "an", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
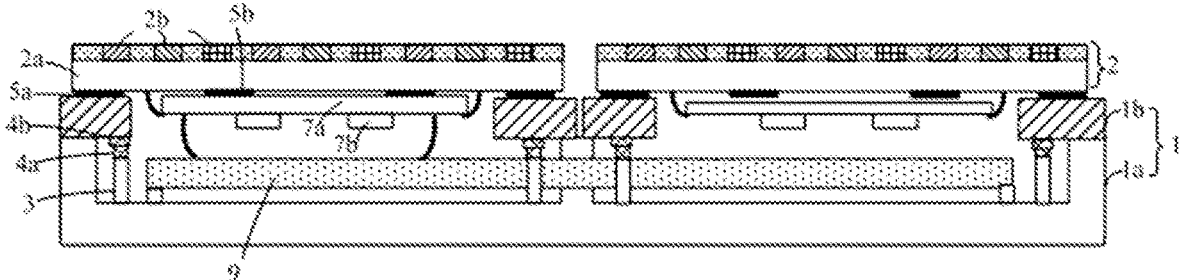
FIG. 1 is a schematic diagram of a splicing display unit in the related art.

FIG. 1 is a schematic diagram of a splicing display unit in the related art. As shown in FIG. 1, the splicing display unit includes a plurality of display panels 2 disposed on a box 1, and each of the display panels 2 may include a plurality of light emitting devices 2b disposed on a glass substrate 2a. The box 1 includes a support frame lb and a rear shell la, and the display panels 2 are fixed on the support frame 1b through an adhesive layer 5a, the support frame is provided with iron sheets 4b, the rear shell 1a is provided with support pillars 3 and magnets 4a located on tops of the support pillars 3, and the magnets 4a and the iron sheets 4b attract each other in an assembly process of splicing display units. Each of the display panels 2 is further connected to a driving circuit board, which includes a Printed Circuit Board (PCB) 7a and a driver chip 7b disposed on the PCB 7a, the PCB 7a is fixed to a backlight side of the display panel 2 through an adhesive layer 5b, and meanwhile, the PCBs 7a are connected to a main drive board 9 of the splicing display units by means of wired connection. The main drive board 9 is connected to a video source interface of a splicing display device, and is configured to perform signal encoding/decoding on video data received through the video source interface, so as to generate a control signal corresponding to a to-be-displayed image of each display panel 2; and the main drive board 9 is further connected to a main voltage input interface, and is configured to perform voltage conversion, so as to generate a voltage signal required for driving the display panels 2 to perform display. In a display process, the driver chip 7b controls the display panel 2 to perform display according to the control signal and the voltage signal from the main drive board 9.

In the splicing display unit shown in FIG. 1, the display panels 2 and the main drive board 9 are connected by means of wired connection, resulting in a problem of inconvenient installation and maintenance.

Figure 2:
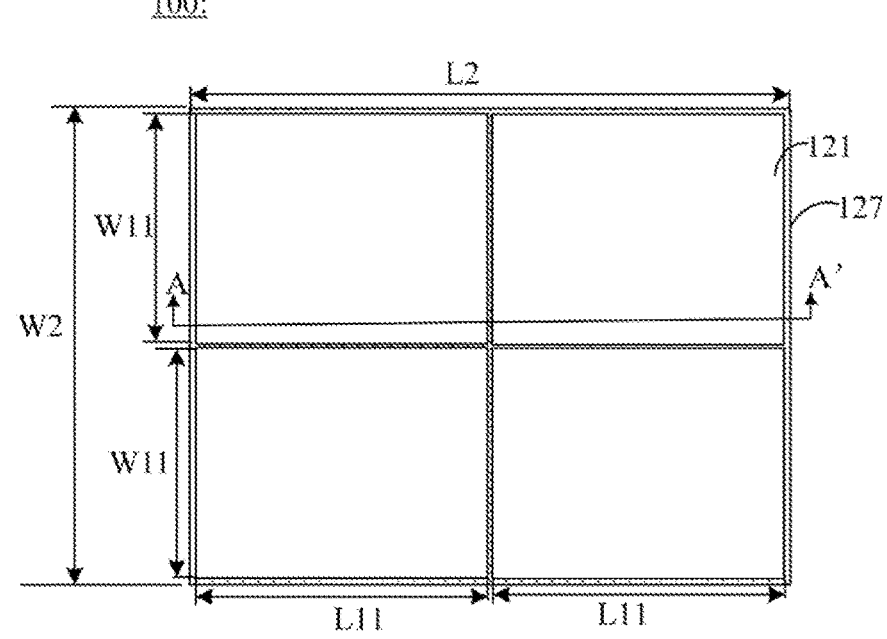
FIG. 2 is a plan view of a splicing display unit according to an embodiment of the present disclosure.
Figure 3:
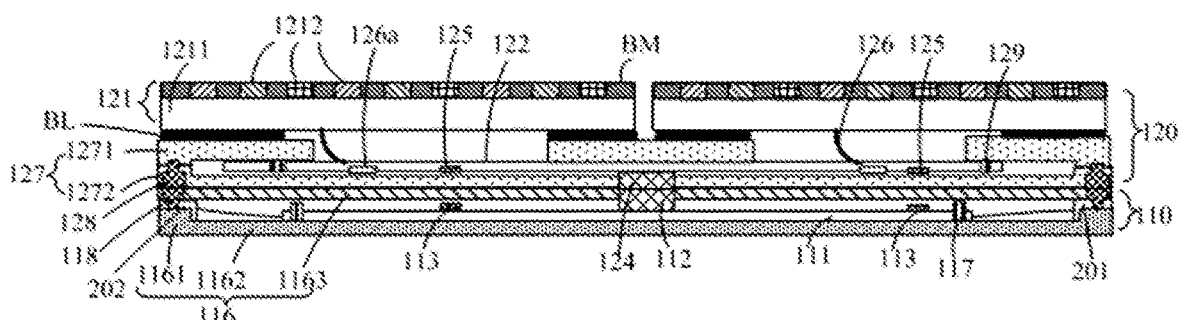
FIG. 3 is a sectional view taken along a line A-A' shown in FIG. 2.
Figure 4:
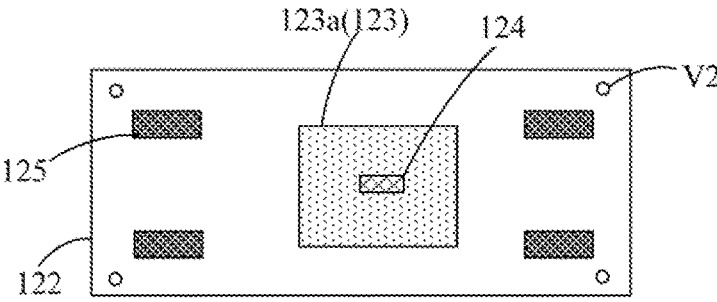
FIG. 4 is a plan view of a first circuit board and a second circuit board shown in FIG. 3.
Figure 4:
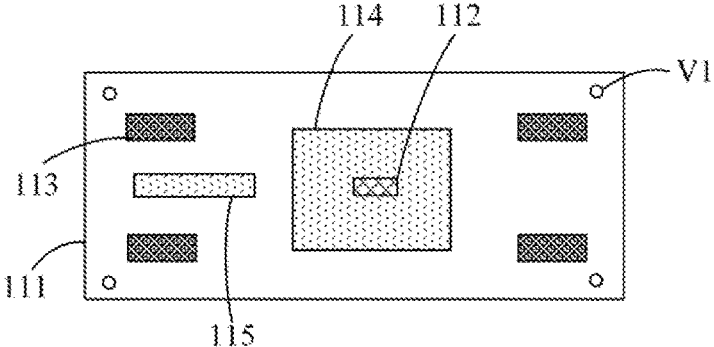

FIG. 2 is a plan view of a splicing display unit according to an embodiment of the present disclosure, FIG. 3 is a sectional view taken along a line A-A' shown in FIG. 2, and FIG. 4 is a plan view of a first circuit board and a second circuit board shown in FIG. 3. As shown in FIG. 2 to FIG. 4, a splicing display unit includes: a display module 120 and a signal source module 110. The signal source module 110 includes: a first circuit board 111 provided thereon with a power structure 114, a first driving structure 115, a first connector 112 and at least one first wireless signal transmitter 113, and the first driving structure 115 and the first connector 112 are both electrically connected to the power structure 114. The first circuit board 111 may be a printed circuit board, and the power structure 114 may be a circuit structure formed by electronic devices such as a capacitor and a resistor on the printed circuit board. The first connector 112 and the power structure 114 may be connected through a signal line on the printed circuit board. The first driving structure 115 may be a receiving card integrated with electronic devices, and the receiving card may be located in any position on the first circuit board 111, so as to be electrically connected to the power structure 114 through a signal line on the first circuit board 111. Certainly, instead of being disposed on the first circuit board 111, the receiving card may be electrically connected to the power structure 114 through an additional wire.

The display module 120 includes: a second circuit board 122, at least one display panel 121, and a second driving structure 123 connected to each display panel 121. The display module 120 may include one display panel 121, or may include a plurality of display panels 121. The second circuit board 122 is provided thereon with a second connector 124 and at least one first wireless signal receiver 125 in one-to-one correspondence with the at least one display panel 121. The first wireless signal receiver 125 and the second connector 124 are both electrically connected to the second driving structure 123.

The first wireless signal receiver 125 is disposed opposite to the first wireless signal transmitter 113 in a one-to-one correspondence way. It should be noted that, "the first wireless signal receiver 125 is disposed opposite to the first wireless signal transmitter 113 in a one-to-one correspon- dence way" refers to that each first wireless signal receiver 125 corresponds to one first wireless signal transmitter 113 and a receiving end of the first wireless signal receiver 125 is opposite to a transmitting end of the first wireless signal transmitter 113 corresponding to the first wireless signal receiver 125, so that it is ensured that the first wireless signal receiver 125 can receive a wireless signal transmitted by the first wireless signal transmitter 113 corresponding thereto.

In some implementations, a distance between the first wireless signal transmitter 113 and the first wireless signal receiver 125 corresponding to the first wireless signal trans- mitter 113 may be less than 10 mm, so as to ensure a signal transmission effect between the first wireless signal trans- mitter 113 and the first wireless signal receiver 125.

The first connector 112 and the second connector 124 are arranged in a one-to-one correspondence way and are detachably connected. The term "detachably connected" here refers to that the first connector 112 and the second connector 124 are not fixedly connected, but can be sepa- rated, for example, detachable connection includes contact connection (that is, the first connector 112 and the second connector 124 can perform conduction of an electrical signal when being in contact), and may also include plug-in connection.

The power structure 114 is configured to output a power signal to the first connector 112 and the first driving structure 115, for example, the power structure 114 performs voltage conversion on an AC voltage received by the splicing display unit to obtain a DC voltage, so as to supply power to the first driving structure 115 and the second driving structure 123. The first driving structure 115 is configured to output, according to a to-be-displayed image of each display panel 121, a display driving signal to the first wireless signal transmitter 113 corresponding to the display panel 121, so as to allow the first wireless signal transmitter 113 to transmit the display driving signal to the first wireless signal receiver 125. For example, the first driving structure 115 performs processing processes, such as signal encoding and decoding, on received image information to obtain a control signal corresponding to the to-be-displayed image of each display panel 121, the control signal is a signal which controls the display panel 121 to perform display and can be transmitted wirelessly, for example, the control signal may include an RGB data signal, a clock signal, a latch signal, an enable signal, and a Serial Peripheral Interface (SPI) signal. The second driving structure 123 is configured to control the display panel 121 to perform display according to a power signal received by the second connector 124 and the display driving signal received by the first wireless signal receiver 125.

In the embodiment of the present disclosure, the splicing display unit includes the display module 120 and the signal source module 110, the display module 120 and the signal source module 110 are electrically connected through the first connector 112 and the second connector 124, and are wirelessly connected through the first wireless signal trans- mitter 113 and the first wireless signal receiver 125, and the signal source module 110 provides a power signal for the display module 120 through the first connector 112 and the second connector 124, and provides the display driving signal for the display module 120 through the first wireless signal transmitter 113 and the first wireless signal receiver 125. The first connector 112 and the second connector 124 are detachably connected, and the first wireless signal trans- mitter 113 and the first wireless signal receiver 125 are wirelessly connected, so that no wired connection structure such as a signal line or a circuit board needs to be disposed between the display module 120 and the signal source module 110, which facilitates installation and maintenance.

In some implementations, the display panel 121 includes a substrate 1211 and a plurality of pixel structures disposed on the substrate 1211, and each of the pixel structures may include a light emitting device 1212. Optionally, the sub- strate 1211 is a glass substrate 1211; the light emitting device 1212 may be a light-emitting diode (LED), such as a Mini-LED or a Micro-LED. A plurality of light emitting devices 1212 may emit light of a plurality of colors (e.g., red, blue and green). For example, the light emitting device 1212 may be soldered on the substrate 1211 by means of reflow soldering or eutectic soldering. A light-shielding layer BM may be further disposed between adjacent light emitting devices 1212. The display module 120 may drive the light emitting device 1212 to emit light by means of passive driving or active driving. When the light emitting device 1212 is driven to emit light by means of active driving, each pixel structure may further include a thin film transistor connected to the light emitting device 1212.

In some implementations, as shown in FIG. 3, the display module 120 further includes at least one flexible printed circuit (FPC) 126 connected to the display panel 121 in a one-to-one correspondence way. One end of the FPC 126 is electrically connected to the display panel 121, and the other end of the FPC 126 is electrically connected to the second circuit board 122. As shown in FIG. 4, the second driving structure 123 may include a driving circuit 123a disposed on the second circuit board 122, and the display panel 121 is electrically connected to the driving circuit 123a disposed on the second circuit board 122 through a corresponding FPC 126. The driving circuit 123a and the display panel 121 may be arranged in a one-to-one correspondence way, and driving circuits 123a corresponding to different display panels 121 may be disposed separately or may be integrated in a same chip.

Figure 5:
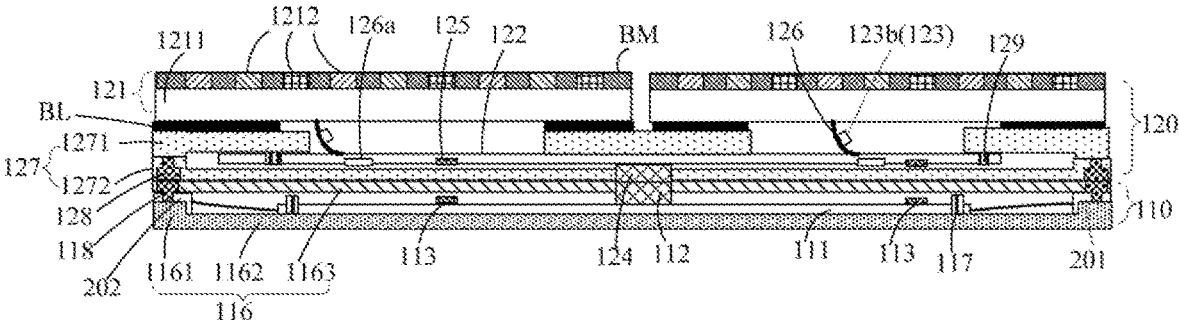
FIG. 5 is another sectional view taken along the line A-A' shown in FIG. 2.
Figure 6:
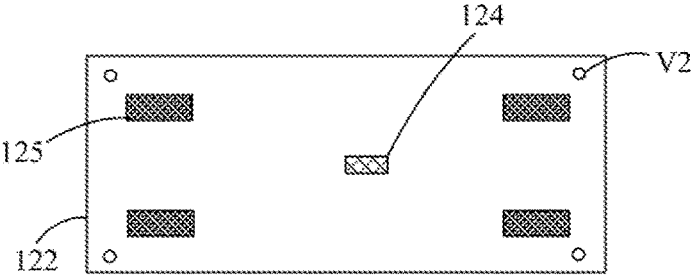
FIG. 6 is a plan view of a first circuit board and a second circuit board shown in FIG. 5.
Figure 6:
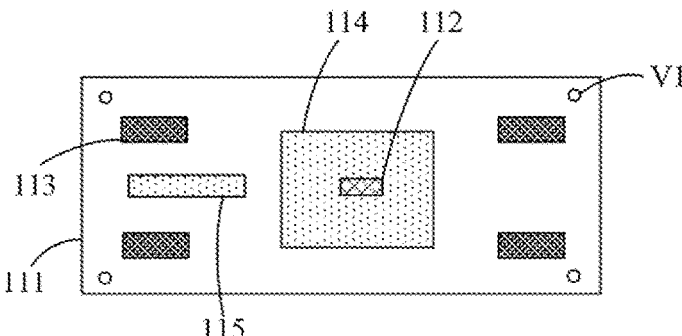

It should be noted that the second driving structure 123 in the embodiment of the present disclosure is not limited to the above arrangement. FIG. 5 is another sectional view taken along the line A-A' shown in FIG. 2, and FIG. 6 is a plan view of a first circuit board and a second circuit board shown in FIG. 5. As shown in FIG. 5 and FIG. 6, the second driving structure 123 includes a driver chip 123b provided on each FPC 126 which is electrically connected to the second circuit board 122. That is, the driver chip 123b is connected to the first wireless signal receiver 125 through the FPC 126 and a signal line disposed on the second circuit board 122, and is connected to the second connector 124 through the FPC 126 and a signal line disposed on the second circuit board 122, so as to receive the display driving signal and the power signal provided by the signal source module 110. In the embodiment of the present disclosure, the FPC 126 may be disposed on the backlight side of the display panel 121, and the FPC 126 and the second circuit board 122 may be connected through a connector 126a (e.g., a Zif connector or a B2B connector). Certainly, the FPC 126 and the second circuit board 122 may be connected by other means, which are not particularly limited herein.

In the embodiment of the present disclosure, a pad is provided on a side of the substrate 1211 away from the second circuit board 122, and electrical connection between the FPC 126 and the display panel 121 refers to that the FPC 126 is electrically connected to the pad of the substrate 1211, so as to provide a signal for a signal line on the substrate 1211 through the pad. The electrical connection between the FPC 126 and the pad of the substrate 1211 is not particularly limited in the embodiment of the present disclosure. For example, the FPC 126 may be connected to the pad through a connection line, so as to drive each light emitting device 1212 to emit light. It should be understood that a portion of the connection line may be located on a side surface of the substrate 1211. As another example, after connected to the pad of the substrate 1211, one end of the FPC 126 is led through a side surface of the substrate 1211 to a side of the substrate 1211 facing the second circuit board 122. As another example, the substrate 1211 is provided with a via, through which the FPC 126 is connected to the pad.

As shown in FIG. 3 and FIG. 5, in some implementations, the signal source module 110 further includes a first box 116, on which the first circuit board 111 is disposed. The display module 120 further includes a second box 127, the second circuit board 122 and the display panel 121 are both disposed on the second box 127, and the first box 116 is detachably connected to the second box 127. It should be noted that "detachably connected" refers to that the first box 116 is capable of being separated from the second box 127.

For example, the first box 116 and the second box 127 are connected by magnetic attraction. In some examples, as shown in FIG. 3 and FIG. 5, the first box 116 is provided with first magnetic members 118, the second box 127 is provided with second magnetic members 128, and the first magnetic members 118 and the second magnetic members 128 are connected by attraction in a one-to-one correspondence way. Each of the first magnetic members 118 and the second magnetic members 128 may be made of magnet, and two ends of the first magnetic member 118 and the second magnetic member 128 close to each other have opposite magnetic properties.

Certainly, it is possible that one of the first box 116 and the second box 127 is provided with magnetic members and the other one of the first box 116 and the second box 127 is provided with an iron sheet.

In some implementations, as shown in FIG. 3 and FIG. 5, the first box 116 includes: a bottom wall 1162, a side wall 1161 and a cover plate 1163, the cover plate 1163 is disposed opposite to the bottom wall 1162, and the bottom wall 1162 is located on a side of the cover plate 1163 away from the display module 120. The first circuit board 111 is disposed between the cover plate 1163 and the bottom wall 1162.

Optionally, the first circuit board 111 may be fixed on the bottom wall 1162 of the first box 116 through a first fastener 117. For example, the first fastener 117 is a screw, as shown in FIG. 4 and FIG. 6, a plurality of first screw holes V1 are provided in the first circuit board 111, and a plurality of first fasteners 117 pass through the first screw holes V1 in a one-to-one correspondence way to fix the first circuit board 111 on the bottom wall 1162 of the first box 116.

Optionally, the first magnetic members 118 are magnetic connectors which connect the cover plate 1163 to the side wall 1161, for example, the first magnetic members 118 are magnetic screws. In practical applications, the number of first magnetic members 118 may be set according to a size of the first box 116, so as to ensure stable connection between the cover plate 1163 and the side wall 1161.

As shown in FIG. 3 and FIG. 5, in some implementations, the second box 127 includes: a rear shell 1272 and a support frame 1271 connected to the rear shell 1272, the support frame 1271 is located between the rear shell 1272 and the display panel 121, the display panel 121 is fixed on a surface of the support frame 1271 away from the rear shell 1272, and the second circuit board 122 is disposed between the display panel 121 and the rear shell 1272. The support frame 1271 may be made of metal, for example, the support frame 1271 may be made of aluminum or an aluminum alloy.

As shown in FIG. 3 and FIG. 5, the display panel 121, the support frame 1271 and the second circuit board 122 define an accommodation space in which the FPC 126 is located.

Optionally, the cover plate 1163 of the first box 116 includes a first insulating part opposite to the first wireless signal transmitter 113, and the rear shell 1272 of the second box 127 includes a second insulating part opposite to the first wireless signal receiver 125, so that no metal structure exists between the first wireless signal transmitter 113 and the first wireless signal receiver 125, which can ensure the signal transmission effect between the first wireless signal transmitter 113 and the first wireless signal receiver 125.

For example, each of the cover plate 1163 and the rear shell 1272 may be made of an insulating material, which may include Polycarbonate (PC); or, the first insulating part is a first through hole disposed in the cover plate 1163, with the other parts of the cover plate 1163 made of metal; the second insulating part is a second through hole provided in the rear shell 1272, with the other parts of the rear shell 1272 made of metal. Certainly, the first insulating part may also be an insulating material filled in the first through hole, and the second insulating part may also be an insulating material filled in the second through hole.

An orthographic projection of the first wireless signal transmitter 113 on the cover plate 1163 may be located in a region where the first insulating part is located, and an orthographic projection of the first wireless signal receiver 125 on the rear shell 1272 may be located in a region where the second insulating part is located, so as to further ensure the signal transmission effect between the first wireless signal transmitter 113 and the first wireless signal receiver 125.

Figure 7:
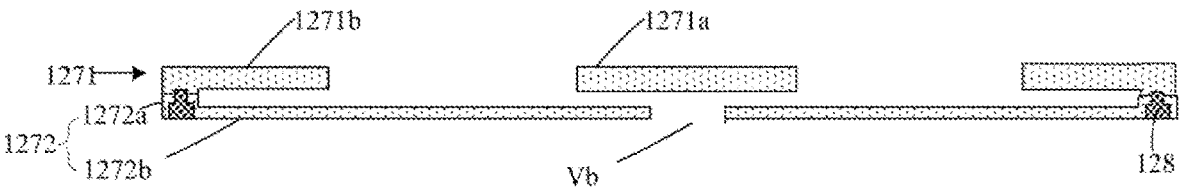
FIG. 7 is a sectional view of a second box shown in FIG. 3 and a second box shown in FIG. 5 along the line A-A' shown in FIG. 2.

In order to facilitate connection between the first connector 112 and the second connector 124, a first opening exposing the first connector 112 is provided in the cover plate 1163. FIG. 7 is a sectional view of the second box shown in FIG. 3 and the second box shown in FIG. 5 along the line A-A' shown in FIG. 2. As shown in FIG. 7, a second opening Vb exposing the second connector 124 is provided in the rear shell 1272.

Optionally, an adhesive layer BL is disposed on a surface of the support frame 1271 away from the rear shell 1272, and the display panel 121 is connected to the support frame 1271 through the adhesive layer BL. For example, the adhesive layer BL is an opaque adhesive layer, so as to prevent external light from entering a space between the display panel 121 and the rear shell 1272 to affect display. In a specific example, the adhesive layer BL adopts a black double-sided tape.

It should be noted that the display panel 121 may be connected to the support frame 1271 by other means, which are not particularly limited herein. For example, the display panel 121 is connected to the support frame 1271 with a fastener such as a screw.

Figure 8:
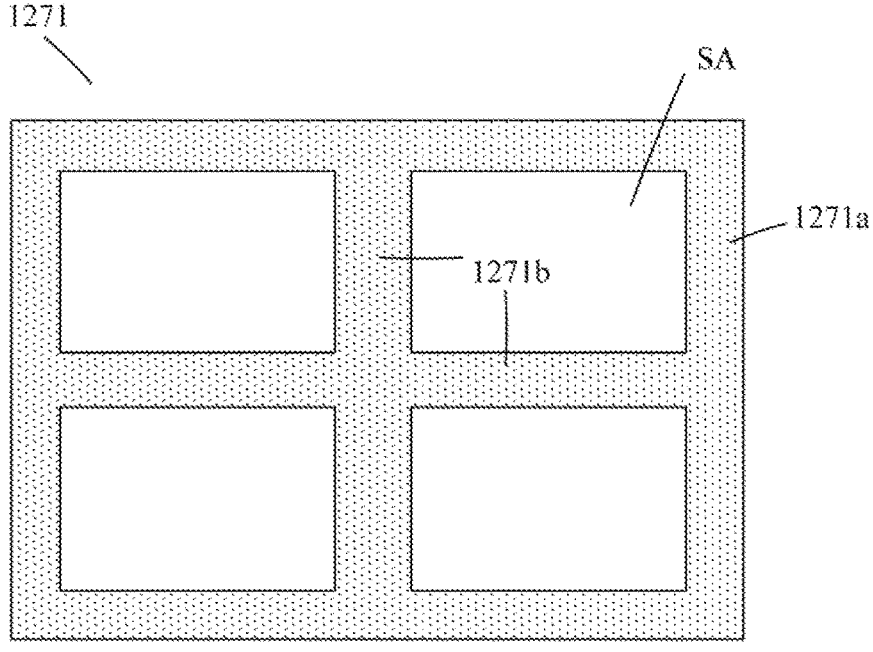
FIG. 8 is a plan view of a support frame shown in FIG. 7.

FIG. 8 is a plan view of the support frame shown in FIG. 7. As described above, the display module 120 may include a plurality of display panels 121. In such case, in order to ensure stability of connection between the display panels 121 and the support frame 1271, as shown in FIG. 3, FIG. 5, FIG. 7 and FIG. 8, the support frame 1271 includes: a side frame 1271a and a partition wall 1271b connected to the side frame 1271a, the partition wall 1271b divides a region surrounded by the side frame 1271a into a plurality of partitions SA, the display panels 121 are disposed in one-to-one correspondence with the partitions SA, and the second circuit board 122 is disposed between the partition wall 1271b and the bottom wall 1162.

Figure 9:
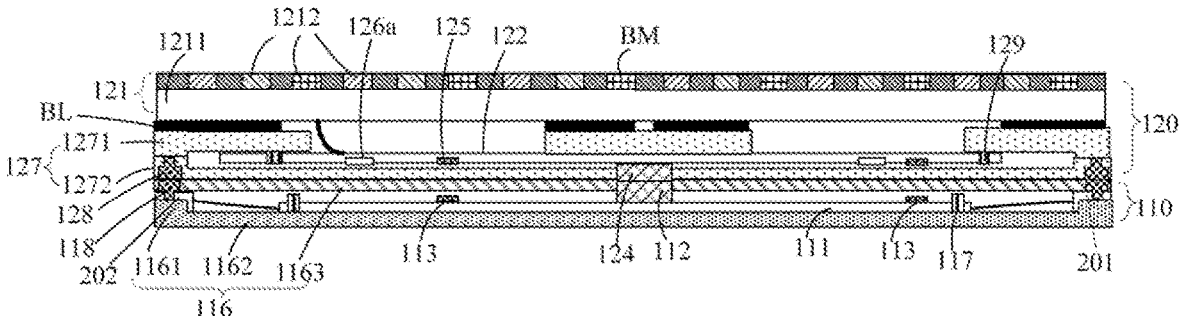
FIG. 9 is a schematic diagram of another splicing display unit according to an embodiment of the present disclosure.

FIG. 9 is a schematic diagram of another splicing display unit according to an embodiment of the present disclosure, the splicing display unit shown in FIG. 9 differs from the splicing display unit shown in FIG. 3 in that the splicing display unit shown in FIG. 9 includes only one display panel 121. It should be noted that the support frame 1271 may also include the side frame 1271a and the partition wall 1271b in the case where the display module 120 includes one display panel 121, so that the stability of the connection between the display panel 121 and the support frame 1271 may be improved; certainly, it is possible that only the side frame 1271a is provided and the partition wall 1271b is omitted, so that only edges of the display panel 121 are fixed on the side frame 1271a.

In some implementations, as shown in FIG. 7, the support frame 1271 and the rear shell 1272 are two independent structures that are connected through a connector. In order to simplify an overall structure of the display module 120, the first magnetic members 118 may be configured as magnetic connectors which connect the support frame 1271 to the rear shell 1272, for example, the first magnetic members 118 are magnetic screws.

For example, as shown in FIG. 7, the rear shell 1272 includes: a bottom plate part 1272b, and a side plate part 1272a connected to the bottom plate part 1272b, a bottom of the side plate part 1272a is connected to the bottom plate part 1272b, and a top of the side plate part 1272a is connected to the support frame 1271. For example, a part of the side frame 1271a is connected to the side plate part 1272a, and the other part of the side frame 1271a is connected to the second circuit board 122. As shown in FIG. 3, FIG. 5 and FIG. 7, the second circuit board 122 may be fixed on the support frame 1271 through second fasteners 129. For example, the second fasteners 129 are screws, as shown in FIG. 4 and FIG. 6, a plurality of second screw holes V2 are provided in the second circuit board 122, and a plurality of second fasteners 129 pass through the second screw holes V2 in a one-to-one correspondence way to fix the second circuit board 122 on the support frame 1271.

Figure 10:
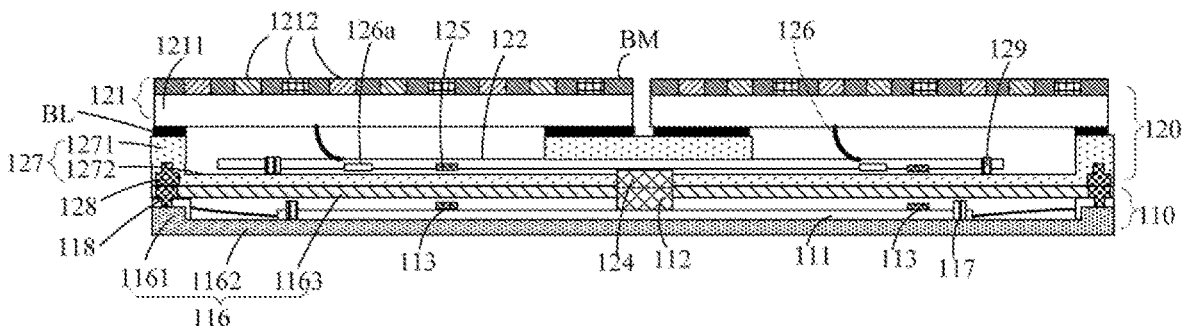
FIG. 10 is a schematic diagram of another splicing display unit according to an embodiment of the present disclosure.

FIG. 10 is a schematic diagram of another splicing display unit according to an embodiment of the present disclosure, the splicing display unit shown in FIG. 10 differs from the splicing display unit shown in FIG. 3 only in a structure of the second box, and FIG. 11 is a schematic diagram of the second box shown in FIG. 10. As shown in FIG. 10 and FIG. 11, the support frame 1271 and the rear shell 1272 may be formed into a one-piece structure, for example, the support frame 1271 and the rear shell 1272 are fixedly connected together by welding or other means, or the support frame 1271 and the rear shell 1272 are formed by integrated molding. It should be noted that, when the support frame 1271 and the rear shell 1272 are of a one-piece structure, the side frame 1271a of the support frame 1271 may be fixed with the rear shell 1272, and the partition wall 1271b of the support frame 1271 and the rear shell 1272 are separated from each other by a certain distance, so as to facilitate arrangement of the second circuit board 122. In addition, when the support frame 1271 and the rear shell 1272 are of a one-piece structure, the second through hole may be formed in the rear shell 1272 and used as the second insulating part, or an insulating material may be filled in the second through hole and used as the second insulating part.

In such case, as shown in FIG. 10, the second circuit board 122 may be fixed on the rear shell 1272 with the second fasteners 129. In addition, the second magnetic members 128 are also disposed on the rear shell 1272. The second magnetic members 128 may be magnetic screws. Unlike the second magnetic member 128 shown in FIG. 3, the second magnetic members 128 shown in FIG. 10 are disposed on the rear shell 1272, and there is no need to connect the support frame 1271 to the rear shell 1272.

In some implementations, edges of the display panel 121 do not extend beyond edges of the second box 127, that is, an orthographic projection of the edges of the display panel 121 on a reference plane, which is a plane where the second box 127 is located, does not extend beyond that of outer edges of the second box 127 on the reference plane. In this way, the substrate 1211 of the display panel 121 may be prevented from being damaged by external impact and a signal line on a side surface of the substrate 1211 may be prevented from being broken by impact, thereby ensuring quality of the splicing display unit.

In some implementations, the display panels 121 in the display module 120 are arranged in m rows and n columns, a sum of dimensions of each row of display panels 121 in a row direction is Ll (for example, if a dimension of each of n display panels 121 in each row is L11, L1=n*L11), and a sum of dimensions of each column of display panels 121 in a column direction is W1 (for example, if a dimension of each of m display panels 121 in each column is W11, W1=m*W11). A dimension of the second box 127 in the row direction is L2, and a dimension of the second box 127 in the column direction is W2. Illustratively, an orthographic projection of each display panel 121 on the second box 127 is rectangular, and accordingly, the display panel 121 has a length, a width and a thickness, and the row direction may be a length direction of the display panel 121 and the column direction may be a width direction of the display panel 121. It should be noted that m and n are both positive integers, and the display module 120 includes one display panel 121 when both m and n are 1.

In a manufacturing process of the splicing display unit, a deviation may exist between an actual dimension of the second box 127 and a target dimension of the second box 127, and the deviation, i.e., a dimensional tolerance of the second box 127, is denoted by a; in addition, the substrate 1211 of the display panel 121 is ground to make the substrate 1211 of the display panel 121 have a theoretical dimension, but a deviation may exist between an actual dimension of the ground substrate 1211 and the theoretical dimension of the ground substrate 1211 due to limitation of grinding accuracy, and the deviation, i.e., a grinding tolerance of the substrate 1211, is denoted by b. In addition, in a process of assembling the display panel 121 and the second box 127, a deviation may exist between an actual region where the display panel 121 is actually located on the second box 127 and a target region where the display panel 121 should be located on the second box 127 due to limitation of assembling accuracy, and the deviation is used for representing assembling accuracy of the display panel 121 and the second box 127 and is denoted by c. In view of those limitations caused by accuracy of production processes, in order to ensure that the edges of the display panel 121 do not extend beyond the edges of the second box 127, a difference between L2 and L1 satisfies: L2−L1≥n(a+b+c), and a difference between W2 and W1 satisfies: W2−W1≥m(a+b+c) in the embodiment of the present disclosure.

In addition, a plurality of splicing display units need to be spliced together in a splicing display device. In such case, if the difference between L2 and L1 is too large, or the difference between W2 and W1 is too large, a relatively obvious gap is generated between adjacent splicing display units and a relatively obvious gap is generated between adjacent display panels 121 in a same splicing display unit, which affects viewing experience. In order to avoid generation of the gaps, the difference between L2 and L1 further satisfies: m d≥L2−L1, and the difference between W2 and W1 satisfies: n d≥W2−W1 in the embodiment of the present disclosure, where d is 3% of center-to-center spacing of two adjacent light emitting devices 1212.

In addition, a third circuit board 201 and a fourth circuit board 202 may be further disposed on the first box 116 of the splicing display unit 100 in the embodiment of the present disclosure, which will be described in detail below and thus is not described here.

FIG. 12 is a schematic diagram of a splicing display device according to an embodiment of the present disclosure. As shown in FIG. 12, a splicing display device includes a plurality of splicing display units 100, and each of the splicing display units 100 is the splicing display unit 100 described in any one of the above embodiments. For example, the plurality of splicing display units 100 may be spliced together and arranged in multiple rows and multiple columns.

Two adjacent splicing display units 100 may be connected through a connecting member, which may be connected to the first boxes of the splicing display units 100. In this way, when the display module of a certain splicing display unit 100 needs to be maintained, the display module can be directly taken off, without affecting display of the other display modules. A specific structure and a specific type of the connecting member are not particularly limited in the embodiment of the present disclosure as long as the two adjacent splicing display units 100 can be stably connected together. It should be noted that the two adjacent splicing display units 100 may refer to two adjacent splicing display units 100 in a same row or two adjacent splicing display units 100 in a same column in the case where the splicing display units 100 are arranged in multiple rows and multiple columns.

Figures 13B, 14:
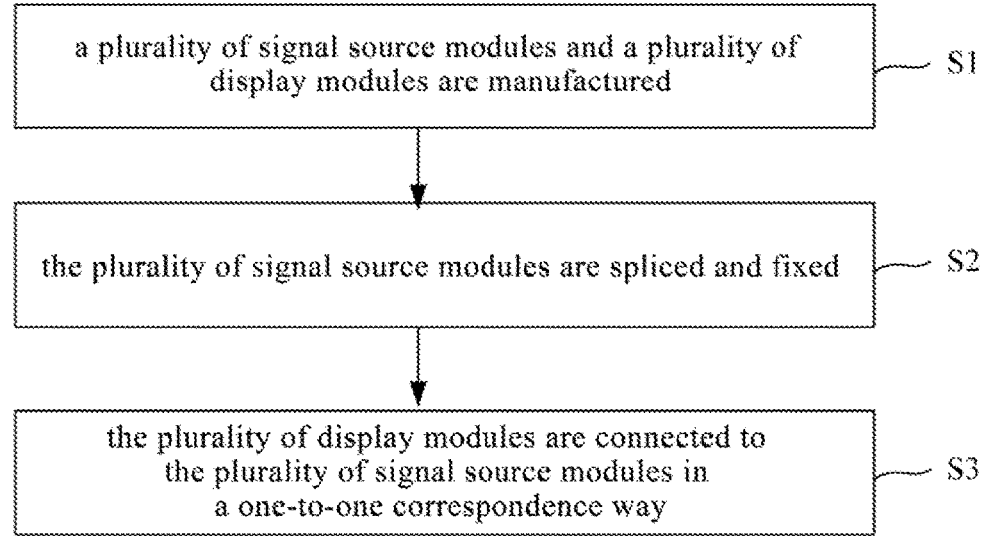
FIG. 13B is a schematic diagram illustrating signal transmission between two adjacent splicing display units according to an embodiment of the present disclosure.
FIG. 14 is a flowchart of a manufacturing method of a splicing display device according to an embodiment of the present disclosure.

FIG. 13A is a schematic diagram illustrating connection of signal source modules of two adjacent splicing display units according to an embodiment of the present disclosure, and FIG. 13B is a schematic diagram illustrating signal transmission between two adjacent splicing display units according to an embodiment of the present disclosure. As shown in FIG. 13A, in some implementations, the splicing display device further includes: a first transmission assembly connected between first circuit boards 111 of every two adjacent splicing display units, and the first transmission assembly includes: a third circuit board 201 and a fourth circuit board 202. As shown in FIG. 13A and FIG. 13B, the third circuit board 201 is provided with a third connector 201a and a second wireless signal transmitter 201b. The fourth circuit board 202 is provided with a fourth connector 202a and a second wireless signal receiver 202b. The second wireless signal transmitter 201a and the second wireless signal receiver 202b are respectively connected to first driving structures 115 of the two adjacent splicing display units 100, and the third connector 201a and the fourth connector 202a are respectively connected to power structures 114 of the two adjacent splicing display units. The third connector 201a and the fourth connector 202a are arranged in a one-to-one correspondence way and are detachably connected. The second wireless signal transmitter 201b and the second wireless signal receiver 202b are arranged opposite to each other in a one-to-one correspondence way, so as to transmit and receive a wireless signal.

For example, the splicing display device may further include a system input structure (not shown) configured to receive an external AC voltage signal and video stream data and provide an AC voltage signal for each splicing display unit 100; and the system input structure is further configured to provide image information for each splicing display unit 100 according to a position of the splicing display unit 100. Through the arrangement of first transmission assemblies, first driving structures 115 of the plurality of splicing display units 100 are cascaded, and power structures 114 of the plurality of splicing display units 100 are also cascaded, so that the power structure 114 of each splicing display unit 100 may receive the AC voltage signal, and the first driving structure 115 of each splicing display unit 100 may receive the image information. In a same splicing display unit 100, the first driving structure 115 outputs, according to a to-be-displayed image of each display panel 121, a display driving signal to the first wireless signal transmitter 113 corresponding to the display panel 121, so as to allow the first wireless signal transmitter 113 to transmit the display driving signal to the first wireless signal receiver 125. The second driving structure 123 controls the display panel 121 to perform display according to the power signal received by the second connector 124 and the display driving signal received by the first wireless signal receiver 125.

For two adjacent splicing display units 100, cascading between the first driving structures 115 thereof may be realized by wireless connection through the second wireless signal transmitter 201b and the second wireless signal receiver 202b. In addition, a second transmission assembly may be further disposed between two adjacent splicing display units 100, and includes a third wireless signal receiver 201c disposed on the third circuit board 201 and a third wireless signal transmitter 201d disposed on the fourth circuit board 202, and the third wireless signal receiver 201c and the third wireless signal transmitter 202c can receive and transmit a wireless signal therebetween. A same splicing display unit 100 may be provided with both the second wireless signal transmitter 201b and the third wireless signal receiver 201c. In this way, when the splicing display device includes a relatively large number of splicing display units 100 (e.g., six splicing display units), two adjacent splicing display units 100 may be cascaded using the second wireless signal transmitter 201b and the second wireless signal receiver 202b in one scenario, so as to allow a wireless signal to be transmitted among the plurality of splicing display units 100 in a first order (for example, the wireless signal is transmitted from a first splicing display unit 100 to a sixth splicing display unit 100); and in another scenario where the second wireless signal transmitter 201b or the second wireless signal receiver 202b is damaged, two adjacent splicing display units 100 may be cascaded using the third wireless signal transmitter 202c and the third wireless signal receiver 201c, so as to allow a wireless signal to be transmitted among the plurality of splicing display units 100 in a second order (for example, the wireless signal is transmitted from the sixth splicing display unit 100 to the first splicing display unit 100).

It should be noted that, when the second wireless signal transmitter and the second wireless signal receiver are both disposed inside the first box 116, a through hole may be provided in a corresponding position of the second box for avoiding an influence on wireless signal transmission. In addition, in order to ensure a transmission effect of a wireless signal, a distance between the second wireless signal transmitter and the second wireless signal receiver may be less than 10 mm.

An embodiment of the present disclosure further provide a manufacturing method of the above splicing display device, and FIG. 14 is a flowchart illustrating the manufacturing method of the splicing display device according to the embodiment of the present disclosure. As shown in FIG. 14, the manufacturing method includes steps S1 to S3.

In the step S1, a plurality of signal source modules and a plurality of display modules are manufactured. Each of the signal source modules includes a first circuit board provided with a power structure, a first driving structure, a first connector and a first wireless signal transmitter, and the first connector is electrically connected to the power structure; and each of the display modules includes: a second circuit board, at least one display panel, and at least one second driving structure in one-to-one correspondence with the display panel, and the second circuit board is provided with a second connector, and at least one first wireless signal receiver in one-to-one correspondence with the display panel, and both the first wireless signal receiver and the second connector are electrically connected to the second driving structure.

In the step S2, the plurality of signal source modules are spliced and fixed. For example, each of the signal source modules further includes the first box described above, the plurality of signal source modules may be disposed on a support table, and first boxes of the plurality of signal source modules may be spliced together.

In S3, the plurality of display modules are connected to the plurality of signal source modules in a one-to-one correspondence way, first wireless signal receivers of the display modules and first wireless signal transmitters of the signal source modules are arranged opposite to each other in a one-to-one correspondence way, and first connectors and second connectors are detachably connected; power structures are configured to output power signals to first connectors; first driving structures are configured to provide display driving signals to the first wireless signal transmitters corresponding to display panels according to to-be-displayed images of the display panels; and second driving structures are configured to control the display panels to perform display according to power signals and display driving signals corresponding to the display panels.

As described above, each of the display modules may further include a second box, and the step S3 may include connecting first magnetic members on the first boxes to second magnetic members on second boxes.

By taking a case where each of the display modules includes a plurality of display panels as an example, a manufacturing process of a splicing display device is described in detail below with reference to the drawings. The manufacturing process of the splicing display device includes the following steps S1 to S3.

In the step S1, a plurality of signal source modules and a plurality of display modules are manufactured. FIG. 15A to FIG. 15F are schematic diagrams of a manufacturing process of the display modules according to an embodiment of the present disclosure, and a manufacturing process of each of the display modules includes the following steps S11*a* to S14*a*.

In the step S11*a*, display panels 121 are provided, and reference may be made to the above description for a structure of each of the display panels 121, which is not repeated here. Each of the display panels 121 is provided with a first alignment mark, which may be disposed on a side of the substrate away from the light emitting device. A shape of the first alignment mark is not limited, for example, the first alignment mark is in a shape of a Chinese character " 卜 " or in a T shape. A length of the first alignment mark is ⅒-⅛ of a length of the light emitting device, and a width of the first alignment mark is ⅒-⅛ of a width of the light emitting device, so that a light-transmitting region may be arranged on the light emitting device to dispose the first alignment mark therein. In addition, it should be noted that light-shielding layers BM may not be provided on the display panels 121 provided in the step S11*a*, and a light-shielding layer BM may be formed on each of the display panels 121 after the step S14*a* or S3 is completed.

In the step S12*a*, as shown in FIG. 15A, a bearing platform 300 having a substantially flat bearing surface is manufactured, for example, flatness of the bearing surface is less than 0.05 mm. The bearing surface is provided with a second alignment mark, and a shape and a size of the second alignment mark may be the same as those of the first alignment mark.

In the step S13*a*, as shown in FIG. 15B, the display panels 121 are fixed on the bearing platform 300, with first alignment marks of the display panels 121 completely overlapping second alignment marks of the bearing platform 300. Optionally, alignment accuracy of the first alignment marks and the second alignment marks is between 5 μm and 20 μm.

In some examples, vacuum adsorption holes are provided in the bearing platform 300, so that the display panels 121 may be fixed on the bearing platform 300 through vacuum adsorption.

In the step S14*a*, the second box is fixedly connected to the display panels 121, and the second circuit board is fixed on the second box.

As described above, the second box 127 may include the rear shell 1272 and the support frame 1271. In a case where the rear shell 1272 and the support frame 1271 are separable structures, the step S14*a* may include the following steps S141*a* to S143*a*.

In the step S141*a*, the support frame 1271 is fixedly connected to the display panels 121. For example, as shown in FIG. 15C, an adhesive layer BL is formed on the support frame 1271; and then the support frame 1271 on which the adhesive layer BL is formed is adhered to the display panels 121 as shown in FIG. 15D.

Illustratively, when the adhesive layer BL is formed on the support frame 1271, a molten adhesive may be dispensed on the support frame 1271 with a dispensing device, for example, a liner adhesive or a drop-shaped adhesive may be dispensed. Since the adhesive can flow, the support frame 1271 may be pressed to be located on a flat surface after the dispensing process is completed.

Certainly, the adhesive layer BL may be formed by other means, for example, an opaque double-sided tape is attached to the support frame 1271 and serves as the adhesive layer BL.

Figure 15E:
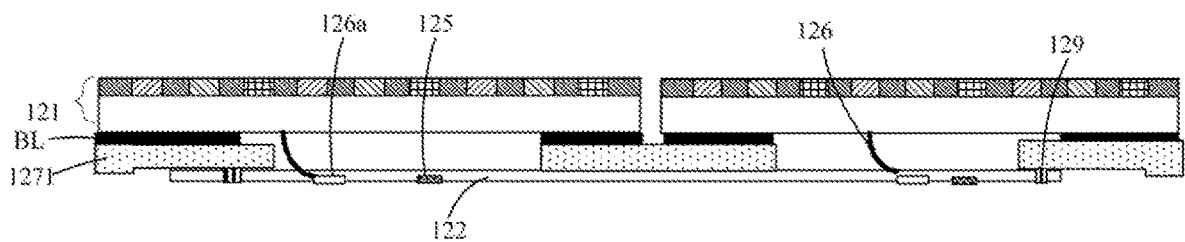
Figure 15F:
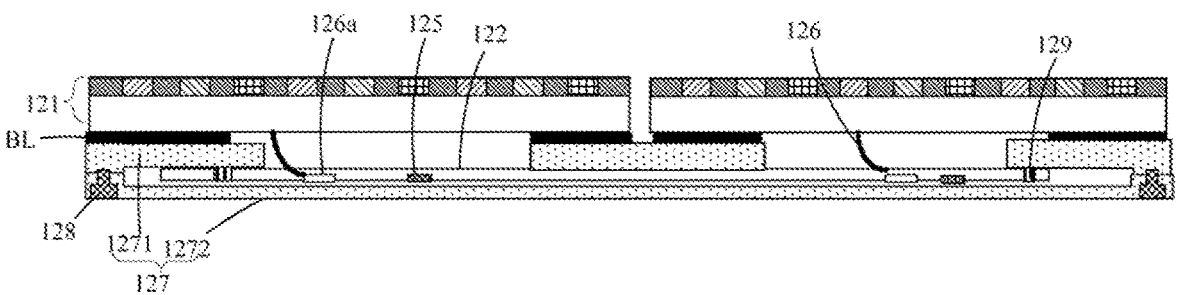

In the step S142*a*, as shown in FIG. 15E, the second circuit board 122 is fixed to the support frame 1271.

Before the display panels 121 are fixed on the bearing platform, one end of each of FPCs 126 may be connected to the display panels 121 in one-to-one correspondence way. The step S142*a* may specifically include: electrically connecting the other end of each of the FPCs 126 to the second circuit board 122, for example, connecting through the connector 126*a* such as a Zif connector or a B2B connector. Then, the second circuit board 122 is fixed to the support frame 1271 through second fasteners 129.

In the step S143*a*, the rear shell 1272 is connected to the support frame 1271 with second magnetic members 128 (e.g., magnetic screws), with the support frame 1271 located between the rear shell 1272 and the display panels 121.

As described above, the rear shell 1272 and the support frame 1271 of the display module may also be an undetachable one-piece structure, in which case the step S 14*a* may specifically include:

fixing the second circuit board 122 on the rear shell 1272, and electrically connecting the FPCs 126 to the second circuit board 122; and then fixedly connecting the second box 127 to the display panels 121, for example, the adhesive layer BL is formed on the support frame 1271 (reference may be made to the description of the step S141*a* for a way of forming the adhesive layer); and adhering the second box 127 on which the adhesive layer BL is formed to the display panels 121.

It should be noted that, in a case where the rear shell 1272 and the support frame 1271 are formed into a one-piece structure, the support frame 1271 may still include the side frame 1271*a* and the partition wall 1271*b* (as shown in FIG. 11) as described above, the partition wall 1271*b* divides a space surrounded by the side frame 1271*a* into a plurality of partitions, and a gap is provided between the partition wall 1271*b* and a bottom of the rear shell 1272 to accommodate the second circuit board 122. In such case, a length and a width of the second circuit board 122 may be set to be relatively small, so as to ensure that the second circuit board 122 can be inserted into the gap between the partition wall 127 1*b* and the bottom of the rear shell 1272.

Figure 16A:
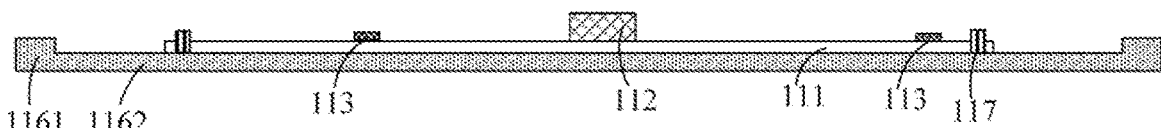
FIG. 16A to FIG. 16C are schematic diagrams illustrating a manufacturing process of a signal source module according to an embodiment of the present disclosure.
Figure 16B:
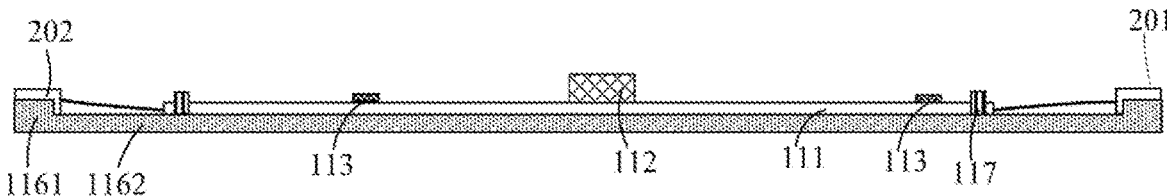
Figure 16C:
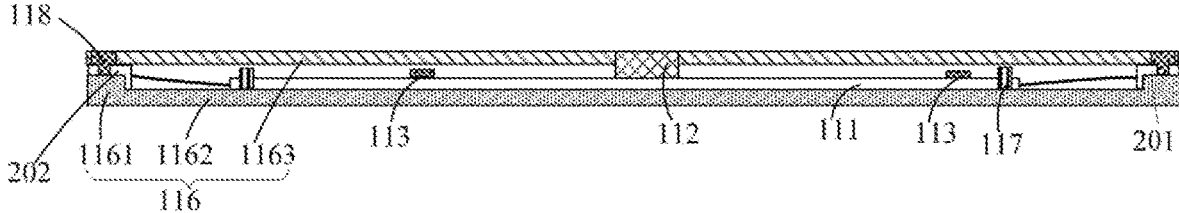

FIG. 16A to FIG. 16C are schematic diagrams of a manufacturing process of a signal source module according to an embodiment of the present disclosure. As shown in FIG. 16A to FIG. 16C, the manufacturing process of the signal source module includes the following steps S11*b* to S14*b*.

In the step S11*b*, a first box 116 is provided, the first box 116 includes: a bottom wall 1162, a side wall 1161 and a cover plate 1163, the bottom wall 1162 and the side wall 1161 may be formed into a one-piece structure, and the cover plate 1163 and the side wall 1161 are separable structures.

In the step S12*b*, as shown in FIG. 16A, a first circuit board 111 is fixed on the bottom wall 1162 of the first box 116.

In the step S13*b*, as shown in FIG. 16B, a third circuit board 201 and a fourth circuit board 202 are disposed on the side wall 1161, and both the third circuit board 201 and the fourth circuit board 202 are electrically connected to the first circuit board 111. A third connector and a second wireless signal transmitter are disposed on the third circuit board 201. A fourth connector and a second wireless signal receiver are disposed on the fourth circuit board.

In the step S14*b*, as shown in FIG. 16C, the cover plate 1163 is connected to the side wall 1161 with first magnetic members 118 which are magnetic screws.

Figure 17A:
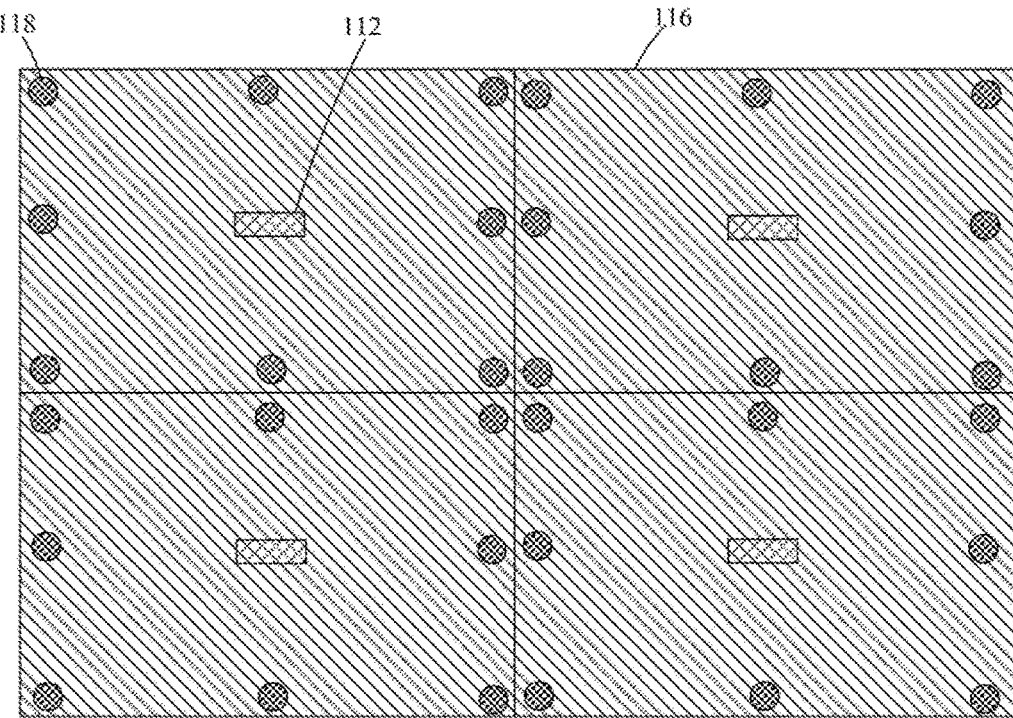
FIG. 17A and FIG. 17B are schematic diagrams illustrating a process of assembling display modules and signal source modules.
Figure 17B:
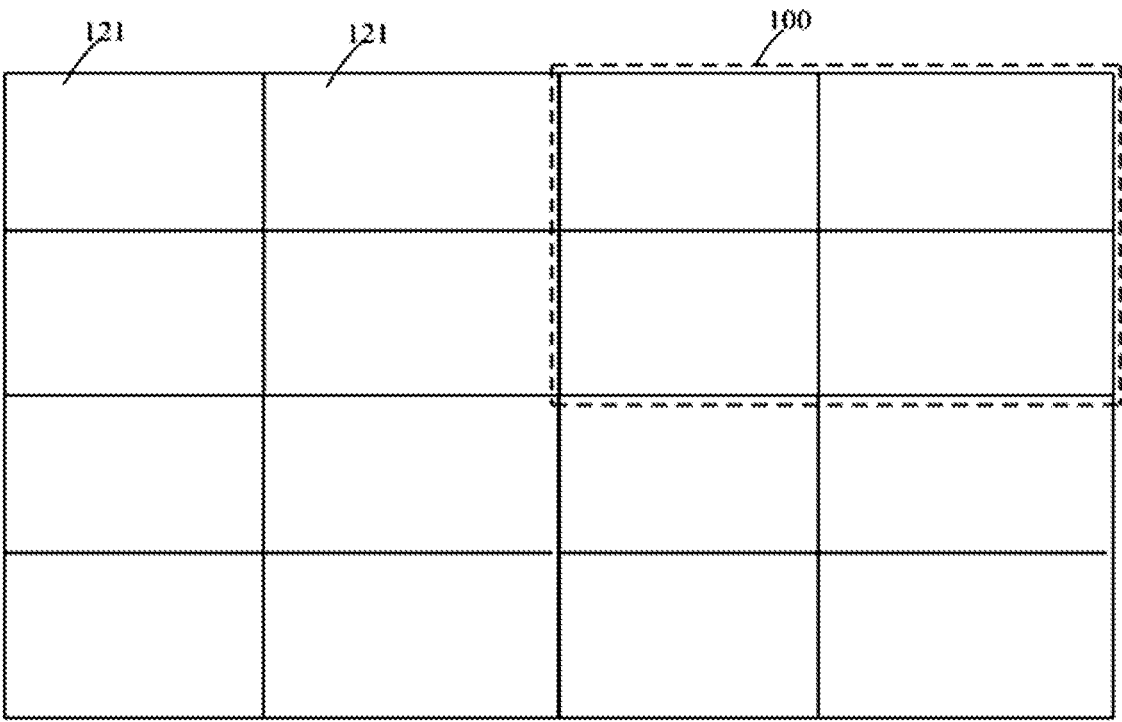

FIG. 17A and FIG. 17B are schematic diagrams illustrating a process of assembling a display modules and signal source modules. As shown in FIG. 17A and FIG. 17B, after each of the display modules and each of the signal source modules are manufactured, the steps S2 and S3 are performed to assemble the display modules and the signal source modules together.

In the step S2, the plurality of signal source modules are spliced and fixed. For example, the plurality of signal source modules are disposed on the support table, and the first boxes of the plurality of signal source modules are spliced together, as shown in FIG. 17A. The first magnetic members 118 are mounted on the first boxes 116, but an end surface of a top of each of the first magnetic members 118 is not covered, and a top of each of the first connectors 112 is not covered either. The third connector and the fourth connector of two adjacent signal source modules are connected, and the second wireless signal transmitter and the second wireless signal receiver of the two adjacent signal source modules are arranged opposite to each other for wireless signal transmission.

In the step S3, the plurality of display modules are connected to the plurality of signal source modules in a one-to-one correspondence way, as shown in FIG. 17B. The step S3 specifically includes: aligning the second boxes 127 with the first boxes 116 in a one-to-one correspondence way, connecting the second magnetic members 128 to the first magnetic members 116 by attraction in a one-to-one correspondence way, and connecting the first connectors 112 to the second connectors 124. It should be noted that, FIG. 17B illustrates an example where each of the display modules includes four display panels 121, but in actual production, each of the display modules may also include display panels 121 in another number, which is not limited herein.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A splicing display unit, comprising: a display module and a signal source module, wherein the signal source module comprises a first circuit board provided with a power structure, a first driving structure, a first connector and at least one first wireless signal transmitter, and the first driving structure and the first connector are both electrically connected to the power structure;

the display module comprises: a second circuit board, at least one display panel, and a second driving structure connected to each display panel, and the second circuit board is provided with a second connector, and at least one first wireless signal receiver in one-to-one correspondence with the display panel, and the first wireless signal receiver and the second connector are both electrically connected to the second driving structure; and the first wireless signal receiver is disposed opposite to the first wireless signal transmitter in a one-to-one correspondence way; the first connector and the second connector are arranged in a one-to-one correspondence way and are detachably connected; the power structure is configured to output a power signal to the first connector and the first driving structure; the first driving structure is configured to output, according to a to-be-displayed image of each display panel, a display driving signal to the first wireless signal transmitter corresponding to the display panel; and the second driving structure is configured to control the display panel to perform display according to the power signal and the display driving signal corresponding to the display panel, wherein the signal source module further comprises a first box on which the first circuit board is disposed; and the display module further comprises a second box, both the second circuit board and the display panel are disposed on the second box, and the first box is detachably connected to the second box.

2. The splicing display unit of claim 1, wherein the display module further comprises at least one flexible printed circuit in one-to-one correspondence with the display panel, one end of each flexible printed circuit is electrically connected to the display panel corresponding thereto, and the other end of each flexible printed circuit is electrically connected to the second circuit board.

3. The splicing display unit of claim 2, wherein the second driving structure comprises: a driver chip disposed on each flexible printed circuit, or, the second driving structure comprises: a driving circuit disposed on the second circuit board.

4. The splicing display unit of claim 1, wherein the first box is provided with first magnetic members, the second box is provided with second magnetic members, and the first magnetic members and the second magnetic members are connected by attraction in a one-to-one correspondence way.

5. The splicing display unit of claim 4, wherein the first box comprises: a bottom wall, a side wall, and a cover plate opposite to the bottom wall, the bottom wall is located on a side of the cover plate away from the display module, the first circuit board is disposed between the cover plate and the bottom wall, and a first opening exposing the first connector is provided in the cover plate;

the first magnetic members are magnetic connecting members which connect the cover plate to the side wall, and the first circuit board is fixed on the bottom wall of the first box through a first fastener.

6. The splicing display unit of claim 1, wherein the second box comprises: a rear shell, and a support frame connected to the rear shell, the support frame is located between rear shell and the display panel, the display panel is fixed on a surface of the support frame away from the rear shell, the second circuit board is disposed between the display panel and the rear shell, and a second opening exposing the second connector is provided in the rear shell, and the second magnetic members are magnetic connecting members which connect the support frame to the rear shell.

7. The splicing display unit of claim 6, wherein the rear shell comprises: a bottom plate part, and a side plate part connected to the bottom plate part, the support frame is connected to the side plate part, and the second circuit board is fixed on the support frame through a second fastener.

8. The splicing display unit of claim 6, wherein the cover plate of the first box comprises a first insulating part opposite to the first wireless signal transmitter; and the rear shell of the second box comprises a second insulating part opposite to the first wireless signal receiver.

9. The splicing display unit of claim 6, wherein the support frame and the rear shell are of a one-piece structure, and the second magnetic member is disposed on the rear shell, and the second circuit board is fixed on the rear shell through a second fastener.

10. The splicing display unit of claim 6, wherein an adhesive layer is provided on a surface of the support frame away from the rear shell, and the display panel is connected to the support frame through the adhesive layer, and the adhesive layer is an opaque adhesive layer.

11. The splicing display unit of claim 6, wherein the display panel, the support frame and the second circuit board define an accommodation space, the display module further comprises at least one flexible printed circuit in one-to-one correspondence with the display panel, one end of each flexible printed circuit is electrically connected to the display panel corresponding thereto, and the other end of each flexible printed circuit is electrically connected to the second circuit board; and each flexible printed circuit is located in the accommodation space.

12. The splicing display unit of claim 6, wherein the display module comprises a plurality of display panels, the support frame comprises: a side frame, and a partition wall connected to the side frame, the partition wall divides a region surrounded by the side frame into a plurality of partitions, the display panels are arranged in one-to-one correspondence with the partitions, and the second circuit board is disposed between the partition wall and the bottom wall.

13. The splicing display unit of claim 1, wherein edges of each display panel do not extend beyond edges of the second box.

14. The splicing display unit of claim 13, wherein the display panel comprises: a substrate and a plurality of light emitting devices arranged on the substrate, the display panels in the display module are arranged in m rows and n columns, a sum L1 of dimensions of each row of display panels in a row direction is less than a dimension L2 of the second box in the row direction, and a sum W1 of dimensions of each column of display panels in a column direction is less than a dimension W2 of the second box in the column direction, where both m and n are positive integers; $nd \geq L2-L1 \geq n$ $(a+b+c)$ and $md \geq W2-W1 \geq m(a+b+c)$, a is a dimensional tolerance of the second box, b is a grinding tolerance of the substrate of the display panel, c is assembling accuracy of the display panel and the second box, and d is 3% of center-to-center spacing of two adjacent light emitting devices.

15. A splicing display device, comprising a plurality of splicing display units, wherein each of the splicing display units is the splicing display unit of claim 1.

16. The splicing display device of claim 15, further comprising:

a transmission assembly connected between first circuit boards of every two adjacent splicing display units, wherein the transmission assembly comprises: a third connector, a fourth connector, a second wireless signal transmitter and a second wireless signal receiver, the second wireless signal transmitter and the second wireless signal receiver are respectively connected to first driving structures of the two adjacent splicing display units, and the third connector and the fourth connector are respectively connected to power structures of the two adjacent splicing display units, and third connectors and fourth connectors are arranged in a one-to-one correspondence way and are detachably connected, and second wireless signal transmitters and second wireless signal receivers are arranged opposite to each other in a one-to-one correspondence way.

17. A manufacturing method of a splicing display device, comprising:

manufacturing a plurality of signal source modules and a plurality of display modules; wherein each of the signal source modules comprises a first circuit board provided with a power structure, a first driving structure, a first connector and a first wireless signal transmitter, and the first driving structure and the first connector are both electrically connected to the power structure; and each of the display modules comprises: a second circuit board, at least one display panel, and a second driving structure connected to each display panel, and the second circuit board is provided with a second connector, and at least one first wireless signal receiver in one-to-one correspondence with the at least one display panel, and the first wireless signal receiver and the second connector are both electrically connected to the second driving structure;

splicing and fixing the plurality of signal source modules;

connecting the plurality of display modules to the plurality of signal source modules in a one-to-one correspondence way, wherein first wireless signal receivers of the display modules and first wireless signal transmitters of the signal source modules are arranged opposite to each other in a one-to-one correspondence way, and first connectors and second connectors are detachably connected; power structures are configured to output power signals to the first connectors and first driving structures; the first driving structures are configured to provide display driving signals to the first wireless signal transmitters corresponding to display panels according to to-be-displayed images of the display panels; and second driving structures are configured to control the display panels to perform display according to the power signals and the display driving signals corresponding to the display panels.

18. The manufacturing method of claim 17, wherein a step of manufacturing each of the display modules comprises:

providing each display panel provided with a first alignment mark;

fixing each display panel on a bearing platform, with the first alignment mark of each display panel completely overlapping a second alignment mark of the bearing platform; and fixedly connecting a second box to each display panel, and fixing the second circuit board on the second box.

19. The manufacturing method of claim 18, wherein each of the signal source modules further comprises a first box on which the first circuit board is disposed, the first box is provided with a first magnetic member, and the second box is provided with a second magnetic member; and connecting the plurality of display modules to the plurality of signal source modules in the one-to-one correspondence way comprises:

aligning first boxes with second boxes in a one-to-one correspondence way, connecting first magnetic members to second magnetic members by attraction in a one-to-one correspondence way, and electrically connecting first connectors to second connectors in a one-to-one correspondence way.

20. A splicing display device, comprising a plurality of splicing display units, wherein each of the splicing display units comprises: a display module and a signal source module, wherein the signal source module comprises a first circuit board provided with a power structure, a first driving structure, a first connector and at least one first wireless signal transmitter, and the first driving structure and the first connector are both electrically connected to the power structure;

the display module comprises: a second circuit board, at least one display panel, and a second driving structure connected to each display panel, and the second circuit board is provided with a second connector, and at least one first wireless signal receiver in one-to-one correspondence with the display panel, and the first wireless signal receiver and the second connector are both electrically connected to the second driving structure; and the first wireless signal receiver is disposed opposite to the first wireless signal transmitter in a one-to-one correspondence way; the first connector and the second connector are arranged in a one-to-one correspondence way and are detachably connected; the power structure is configured to output a power signal to the first connector and the first driving structure; the first driving structure is configured to output, according to a to-be-displayed image of each display panel, a display driving signal to the first wireless signal transmitter corresponding to the display panel; and the second driving structure is configured to control the display panel to perform display according to the power signal and the display driving signal corresponding to the display panel, and wherein the splicing display device further comprises: a transmission assembly connected between first circuit boards of every two adjacent splicing display units, wherein the transmission assembly comprises: a third connector, a fourth connector, a second wireless signal transmitter and a second wireless signal receiver, the second wireless signal transmitter and the second wireless signal receiver are respectively connected to first driving structures of the two adjacent splicing display units, and the third connector and the fourth connector are respectively connected to power structures of the two adjacent splicing display units, and third connectors and fourth connectors are arranged in a one-to-one correspondence way and are detachably connected, and second wireless signal transmitters and second wireless signal receivers are arranged opposite to each other in a one-to-one correspondence way.

* * * * *